United States Patent [19]
Segawa

[11] Patent Number: 5,812,476
[45] Date of Patent: Sep. 22, 1998

[54] REFRESH CIRCUIT FOR DRAM WITH THREE-TRANSISTOR TYPE MEMORY CELLS

[75] Inventor: Yuuichi Segawa, Tokyo, Japan

[73] Assignee: Kawasaki Steel Corporation, Kobe, Japan

[21] Appl. No.: 902,105

[22] Filed: Jul. 29, 1997

[30] Foreign Application Priority Data

Jul. 30, 1996 [JP] Japan .................................. 8-200374

[51] Int. Cl.⁶ ...................................................... G11C 7/00
[52] U.S. Cl. ........................ 365/222; 365/187; 365/188; 365/149; 365/150; 365/230.05
[58] Field of Search .................... 365/187, 188, 365/149, 150, 222, 230.05

[56] References Cited

U.S. PATENT DOCUMENTS

4,935,896  6/1990  Matsumura et al. ................... 365/187
5,652,728  7/1997  Hosotani et al. ........................ 365/210
5,710,742  1/1998  Carter et al. ....................... 365/230.05

Primary Examiner—David C. Nelms
Assistant Examiner—VanThu T. Nguyen
Attorney, Agent, or Firm—Oliff & Berridge, PLC

[57] ABSTRACT

A semiconductor memory device of a three-transistor cell type dynamic random-access memory with improved performances includes a circuit arranged between a write bit line and a read bit line. During a read operation, the circuit generates a voltage difference responsive to information that is stored in the memory cell during a read operation. A latch-type sense amplifier amplifies and latches the voltage difference between the write bit line and the read bit line. When information is read from a memory cell, the information in the memory cell amplified by the latch-type sense amplifier is read through the read bit line while being written to the memory cell via the write bit line to refresh the information in the memory cell.

14 Claims, 7 Drawing Sheets

REFRESH CIRCUIT FOR DRAM WITH THREE-TRANSISTOR TYPE MEMORY CELLS

BACKGROUND OF THE INVENTION

1. Field of Invention

The present invention relates to a semiconductor memory device and more particularly to a three-transistor cell type dynamic random-access memory constructed of an array of dynamic memory cells, each constructed of three transistors.

2. Description of Related Art

Among other semiconductor memory devices, dynamic random-access memories (DRAMs) permit high density design, and are one of memories on which a great deal of development efforts is actively concentrating. Although a majority of today's DRAMs are one-transistor and one-capacitor DRAMs, a three-transistor cell type DRAM is catching attention particularly in the ASIC field because it offers the possibility of higher density design than six-transistor type static random-access memory (SRAM). Three-transistor type DRAMs are now developed as an ASIC memory.

Figure 8:
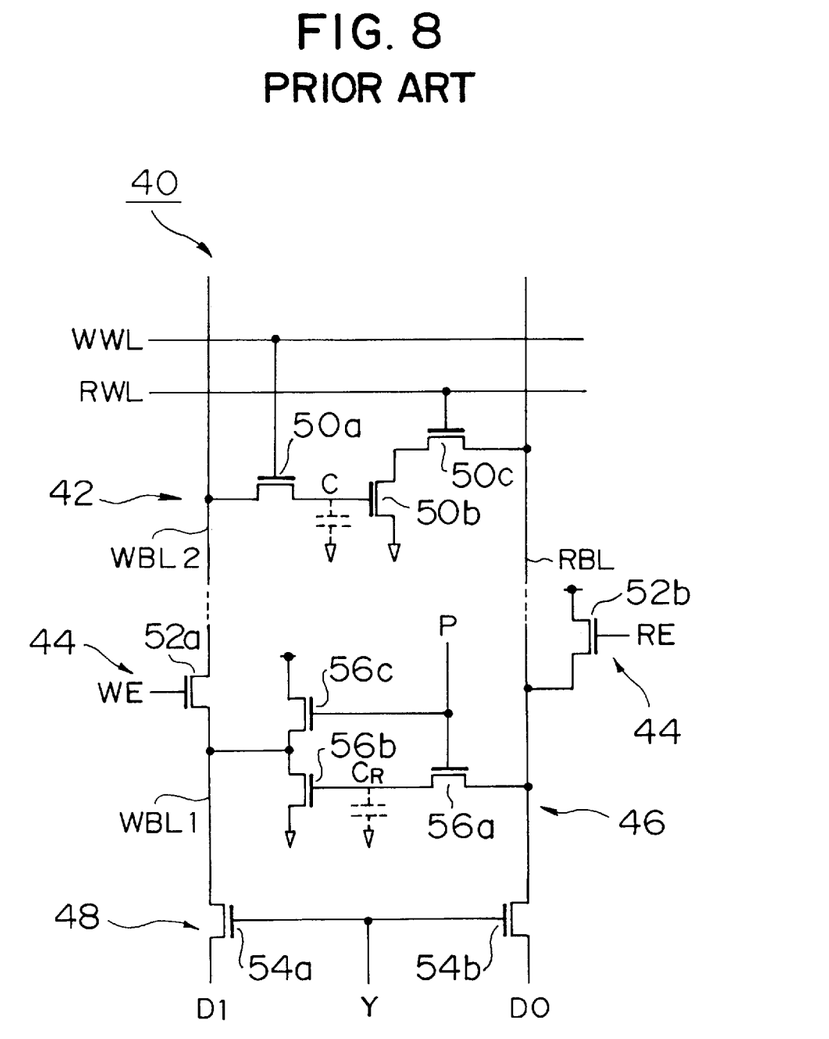
FIG. 8 is a schematic diagram showing a known semiconductor memory device.

FIG. 8 is a schematic diagram of a known three-transistor cell type DRAM. The three-transistor cell type DRAM 40 includes a three-transistor type memory cell 42 constructed of three transistors, a control circuit 44 for writing and reading data, a refresh circuit 46 for retaining information stored in the memory cell 42, (i.e, for refreshing the memory cell 42), and a column selector 48 for selecting a specified column.

The memory cell 42 includes N-type MOS transistors (hereinafter referred to as NMOS transistors) 50a, 50b, and 50c. NMOS transistor 50a is configured with its input and output nodes respectively connected to a write bit line WBL 2 and the gate of NMOS transistor 50b, and with its gate connected to a write word line WWL. NMOS transistor 50b is configured with its source grounded and with its drain connected to the source of NMOS transistor 50c. NMOS transistor 50c is configured with its drain connected to a read bit line RBL and with its gate connected to a read word line RWL.

The control circuit 44 includes NMOS transistors 52a, 52b. NMOS transistor 52a is configured with its input and output nodes respectively connected to write bit lines WBL 1, WBL 2, and with its gate connected to a write enable line WE. NMOS transistor 52b is configured with its source connected to a power supply, with its drain connected to the read bit line RBL, and with its gate connected to a read enable line RE. NMOS transistor 52b works as a load circuit when data is read.

The column selector 48 includes NMOS transistor 54a, 54b. NMOS transistor 54a is configured with its input and output nodes respectively connected to the write bit line WBL 1 and a data input line DI. NMOS transistor 54b is configured with its input and output nodes respectively connected to the read bit line RBL and a data output line DO. The gates of NMOS transistors 54a, 54b are connected together to a column select line Y.

The refresh circuit 46 includes NMOS transistors 56a, 56b, and 56c. NMOS transistor 56a is configured with its input and output nodes respectively connected to the read bit line RBL and the gate of NMOS transistor 56b. The source of NMOS transistor 56b is grounded, and the source of NMOS transistor 56c is connected to the power supply. The drains of NMOS transistors 56b, 56c are both connected to the write bit line WBL 1. The gates of NMOS transistors 56a, 56c are both connected to a refresh line P.

A write operation to the memory cell 42 in the DRAM 40 is performed as follows. After the refresh line P is driven low to electrically decouple the refresh circuit 46 from the write bit line WBL 1, the column select line Y, write enable line WE, and write word line WWL are driven high so that write data input from the data input line DI through NMOS transistors 54a, 52a and 50a is written to a storage node C.

When a high level is input as write data, the data input line DI is driven high, writing a high level to the storage node C.

On the other hand, when a low level is input as write data, the data input line DI is driven low, writing a low level to the storage node C.

A read operation from the memory cell 42 is performed as follows. After the refresh line P is also driven low to electrically decouple the refresh circuit 46 from the write bit line WBL 1, the read word line RWL, read enable line RE and column select line Y are driven high so that the information stored at the storage node C of the memory cell 42 is read to the data output line DO via NMOS transistors 50b, 50c, and 54b.

When a high level is stored at the storage node C, the read bit line RBL is discharged because NMOS transistor 50b is turned on. Although a low level is thus transferred to the data output line DO, the low level is invert-amplified by a sense amplifier (not shown), for example, and a high level is thus read. On the other hand, when a low level is stored at the storage node C, NMOS transistor 50b remains off. Although a high level, pre-charged by NMOS transistor 52b, is transferred to the data output line DO, a low level is read after again being invert-amplified.

A memory refresh operation of the memory cell 42 will now be described. The column select line Y is first driven low. After the memory cell 42 is electrically decoupled from the data input line DI and data output line DO, the read word line RWL, read enable line RE and refresh line P are driven high so that the information at the storage node C is transferred, in its inverted form, to a storage node CR. The write enable line WE and write word line WWL are driven high so that the information at the storage node CR is transferred, in its inverted form, to the storage node C.

When a high level is stored at the storage node C, the read bit line RBL is discharged because NMOS transistor 50b is turned on, and a low level is transferred to the storage node CR. NMOS transistors 56b and 56c are turned off and on, respectively, causing the write bit lines WBL 1 and WBL 2 to be charged up to a high level. A high level, which is the same level as the information stored in the storage node C, is written back on the storage node C.

When a low level is stored at the storage node C, the read bit line RBL retains the high level pre-charged by NMOS transistor 52b, because NMOS transistor 50b is turned off. The high level is transferred to the storage node CR. NMOS transistors 56b, 56c are respectively turned on and off, causing the write bit line WBL to be discharged to a low level. A low level is written to the storage node C.

In this way, the memory cell 42 in the three-transistor cell type DRAM 40 dynamically retains one bit of information by storing logic information at a single circuit node (the storage node C in FIG. 8). The storage node C is a node of NMOS transistor 50a and NMOS transistor 50b from which a charge leak such as a junction leak inevitably takes place. Information stored at the storage node C disappears over time. For this reason, information at the memory cell 42 needs periodic refresh operations.

In the conventional three-transistor cell type DRAM 40, to transfer information at the DRAM 40 to another logic circuit, the information is read from DRAM 40, and the read information is written to the logic circuit. A refresh operation may be initiated in the middle of data transfer. During an refresh operation, no data is read from DRAM 40, and the efficiency of data transfer is lowered.

SUMMARY OF THE INVENTION

It is an object of the present invention to provide a semiconductor memory device of a three-transistor cell type DRAM that presents improved performance by completing a refresh operation along with a data read operation.

The semiconductor device of an array of dynamic memory cells for writing and reading one-bit information, through a write bit line and a read bit line, to and from each cell of three transistors may include a circuit arranged between the write bit line and the read bit line for generating a voltage difference responsive to the information that is stored in the memory cell during a read operation. A sense amplifier amplifies and latches the voltage difference between the write bit line and the read bit line. Further when the information is read from the memory cell, the information from the memory cell amplified by the latch-type sense amplifier is read through the read bit line while being written to the memory cell by the write bit line to refresh the information in the memory cell.

The circuit arranged between the write bit line and the read bit line may include a pre-charge circuit for pre-charging the write bit line and the read line to equal voltages and a dummy cell for discharging the write bit line that is pre-charged in response to a signal on a dummy word line.

Further, the circuit arranged between the write bit line and the read bit line may include a pre-charge circuit for pre-charging the write bit line and the read bit line to generate a differential voltage therebetween.

BRIEF DESCRIPTION OF THE DRAWINGS

The invention will be described with reference to the following drawings in which like reference numerals refer to like elements and wherein.

DETAILED DESCRIPTION OF PREFERRED EMBODIMENTS

Embodiments of the semiconductor memory device of the present invention will now be described in detail with reference to the drawing.

Figure 1:
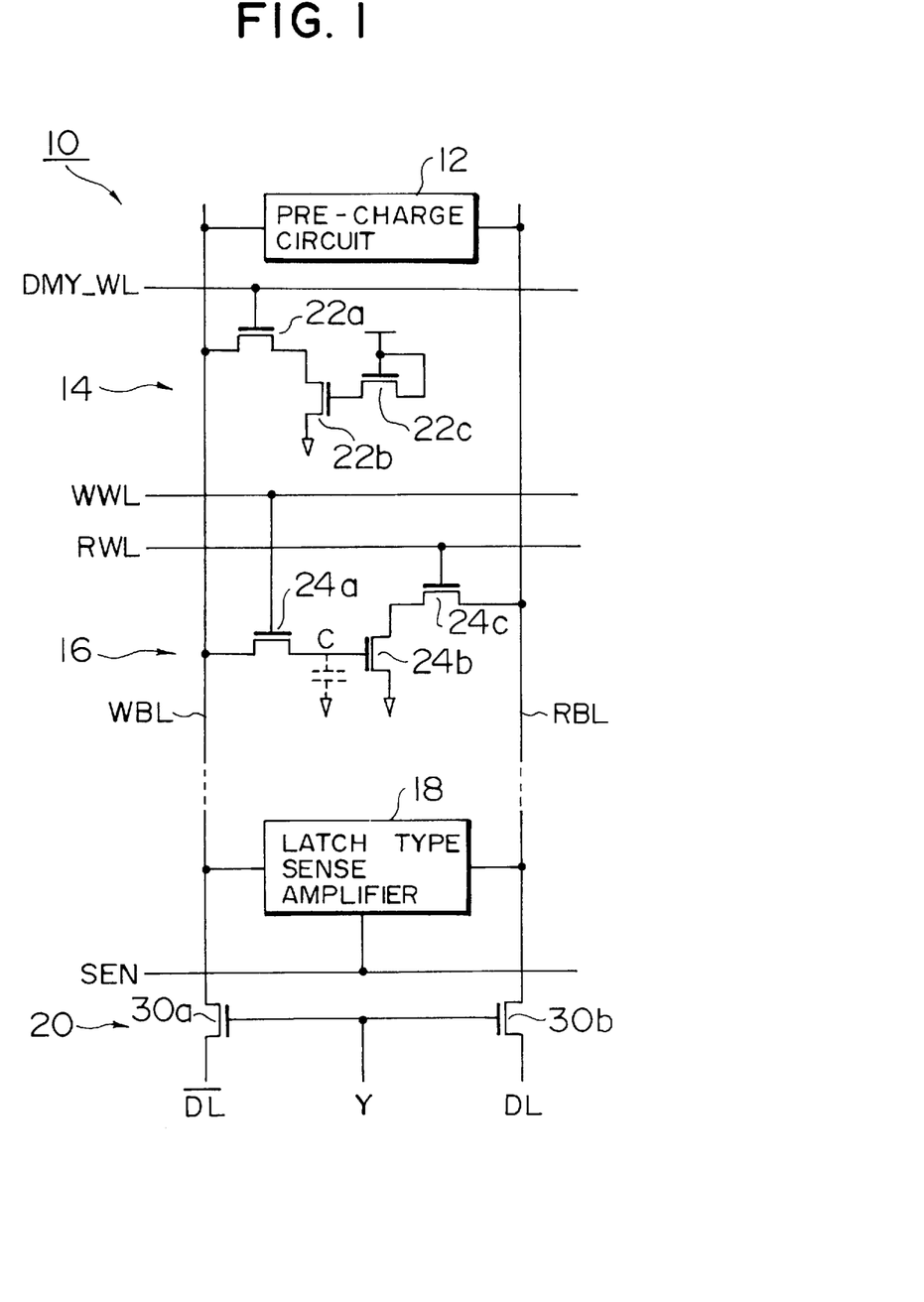
FIG. 1 is a schematic diagram of a first embodiment of the semiconductor memory device of the present invention.

FIG. 1 is a schematic diagram of a first embodiment of the three-transistor cell type DRAM, semiconductor memory device of the present invention. The three-transistor cell type DRAM 10 is constructed of a memory array with a plurality of word rows arranged from top to bottom and with a plurality of bit columns arranged from left to right. Each bit column includes a pre-charge circuit 12, a dummy cell 14, a memory cell 16, a latch-type sense amplifier 18 and a column selector 20.

In the three-transistor cell type DRAM 10, the pre-charge circuit 12 pre-charges a write bit line WBL and a read bit line RBL to a substantially identical voltage equal to a power supply voltage during a standby state in which neither read operation nor write operation is performed. As discussed below, in the present invention a refresh operation is concurrently performed along with a read operation.

Figure 2:
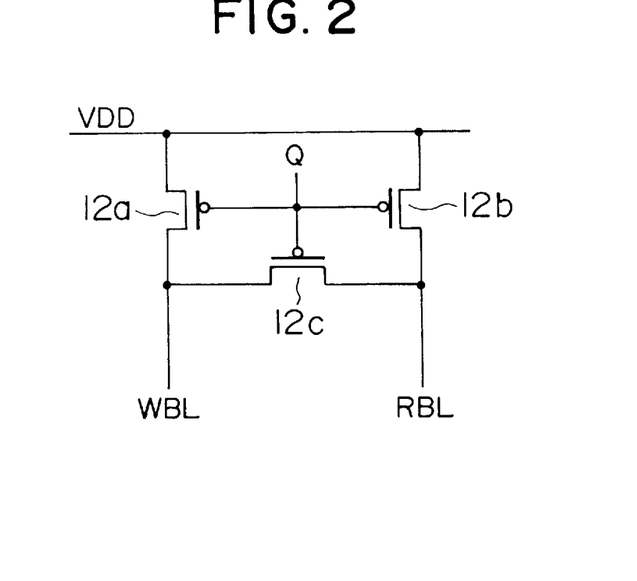
FIG. 2 is a schematic diagram of a pre-charge circuit that may be used in the first embodiment.

One example of the pre-charge circuit 12 of the first embodiment is shown in FIG. 2. The circuit includes three PMOS transistors 12a, 12b, and 12c. The sources of transistors 12a, 12b are connected together to a power supply voltage VDD, and the drains of transistors 12a, 12b are connected to the write bit line WBL and the read bit line RBL, respectively. The drain and source of transistor 12c are connected to the write bit line WBL and the read bit line RBL, respectively. The gates of these three transistors are supplied with a common pre-charge signal Q. When the pre-charge signal is transitioned to a low level, the write bit line WBL and the read bit line RBL are pre-charged to a voltage substantially equal to VDD.

The dummy cell 14 is provided for, when data in the memory cell 16 with its storage node C at a low level is read, the write bit line WBL pre-charged by the pre-charge circuit 12 is discharged such that the voltage difference responsive to the low level stored at the storage node C is generated between the write bit line WBL and the read bit line RBL to cause the latch-type sense amplifier 18 (to be described below) to operate correctly.

The dummy cell 14 includes NMOS transistors 22a, 22b, and 22c. NMOS transistor 22a is configured with its drain connected to the write bit line WBL, with its source connected to the drain of NMOS transistor 22b, and with its gate connected to a dummy word line DMY_WL. NMOS transistor 22b is configured with its source grounded, with its gate connected to the source of NMOS transistor 22c. The gate and drain of NMOS transistor 22c are both connected to the power supply.

The memory cell 16 is one example of the three-transistor type DRAM memory cell, and includes transistors 24a, 24b, and 24c. The memory cell 16 stores one-bit information with a low level and a high level at its storage node C.

In the memory cell 16, NMOS transistor 24a is configured with its input node connected to the write bit line WBL, with its output node connected the gate of NMOS transistor 24b, and with its gate connected to a write word line WWL. NMOS transistor 24b is configured with its source grounded, and with its drain connected to the source of NMOS transistor 24c. NMOS transistor 24c is configured with its drain connected to the read bit line RBL and with its gate connected to a read word line RWL.

The latch-type sense amplifier 18 reads the information stored in the memory cell 16 while amplifying the voltage difference taking place between the write bit line WBL and the read bit line RBL to a maximum amplitude and then latching it. The latch-type sense amplifier 18 is configured with its input and output nodes connected to the write bit line WBL and the read bit line RBL, respectively, and with its enable node connected to a sense enable line SEN.

Figure 3:
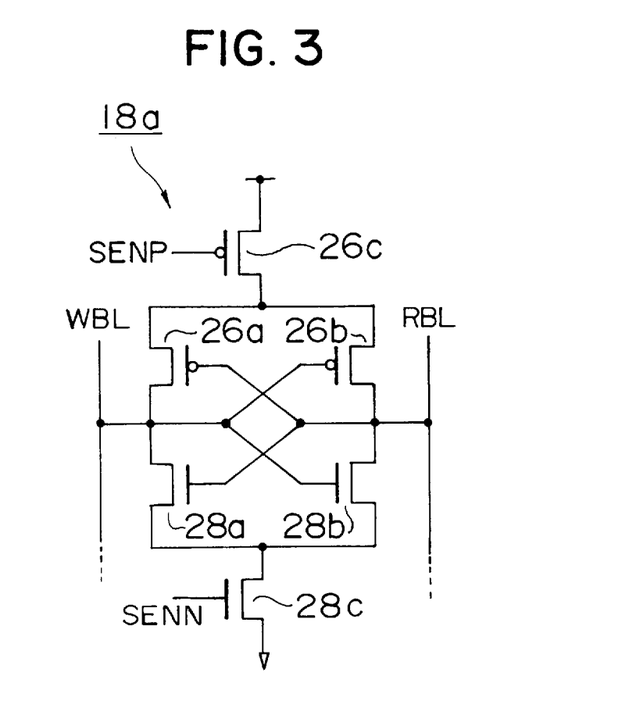
FIG. 3 is a schematic diagram of one embodiment of a latch-type sense amplifier.

FIG. 3 is a schematic diagram of one embodiment of the latch-type sense amplifier.

A latch-type sense amplifier 18a may include PMOS transistors 26a, 26b, 26c and NMOS transistors 28a, 28b, and 28c. PMOS transistor 26a and NMOS transistor 28a in combination and PMOS transistor 26b and NMOS transistor 28b in combination respectively form CMOS inverters. Input and output nodes of these inverters are cross-coupled, and respectively connected to the write bit line WBL and the read bit line RBL.

The sources of PMOS transistors 26a, 26b constituting the inverters are both connected to the drain of PMOS transistor 26c, and the sources of NMOS transistors 28a, 28b are both connected to the drain of NMOS transistor 28c. The sources of PMOS transistor 26c and NMOS transistor 28c are connected to the power supply and ground, respectively. The gates of PMOS transistor 28c and NMOS transistor 26c are respectively supplied with a sense enable signal SENN corresponding to SEN on the sense enable line in FIG. 1 and inverted sense enable signal SENP.

The operation of the above described latch-type sense amplifier 18a is briefly described assuming that the memory cell 16 now stores a high level (a low level at the storage node C).

The information in the memory cell 16 is read onto the read bit line RBL. After a sufficient voltage difference takes place between the write bit line WBL and the read bit line RBL, the sense enable line SENN is gradually raised to a high level. NMOS transistor 28a is turned on when the voltage difference between its gate and source exceeds its threshold. The drain of NMOS transistor 28a, namely the gate of NMOS transistor 28b is driven low, thereby turning off NMOS transistor 28b.

When the sense enable line SENN, SENP are fully driven high and low, respectively, PMOS transistor 26b is turned on, because the drain of NMOS transistor 28a, namely, the gate of PMOS transistor 26b is at a high level, and PMOS transistor 26a is turned off, because the drain of PMOS transistor 28b, namely, the gate of PMOS transistor 26a is at a high level. In this way, information at the memory cell 16 is latched, amplified and output by the latch-type sense amplifier 18a.

The column selector 20, including NMOS transistors 30a, 30b, controls data write to the memory cell 16 at a selected column. The input and output nodes of NMOS transistor 30a are respectively connected to the write bit line WBL and an inverted data line DL-, and the input and output nodes of NMOS transistor 30b are respectively connected to the read bit line RBL and a data line DL. The gates of NMOS transistors 30a and 30b are together connected to the column select line Y.

The operation of the three-transistor cell type DRAM 10 will now be discussed referring to timing diagrams shown in FIGS. 4A and 4B.

During the standby state in which neither write operation nor read operation is performed to the memory cell 16, the pre-charge circuit 12 is turned on and both the write bit line WBL and the read bit line RBL are pre-charged to the same voltage (i.e., the power supply voltage).

In a write operation to the memory cell 16, the pre-charge circuit 12 is turned off. After the pre-charging of the write bit line WBL and the read bit line RBL is stopped, the column select line Y and write word line WWL are driven high. Out of write data input through the inverted data line DL- and the data line DL, write data input through the inverted data line DL- is written to the storage node C via NMOS transistors 30a, 24a.

When a high level is input as write data, for example, the inverted data line DL- and the data line DL are respectively driven low and high, and a low level is written to the storage node C. On the other hand, when a low level is input, as write data, for example, the inverted data line DL- and the data line DL are respectively driven high and low, and a high level is written to the storage node C.

To read information retained in the memory cell 16, the pre-charge circuit 12 is turned off. After the pre-charging of the write bit line WBL and the read bit line RBL is stopped, the dummy word line DMY_WL and the read word line RWL are driven high, the dummy cell 14 is turned on, and NMOS transistor 24c is turned on. The information stored at the storage node C is read to the read bit line RBL via NMOS transistors 24b, 24c.

Figure 4A:
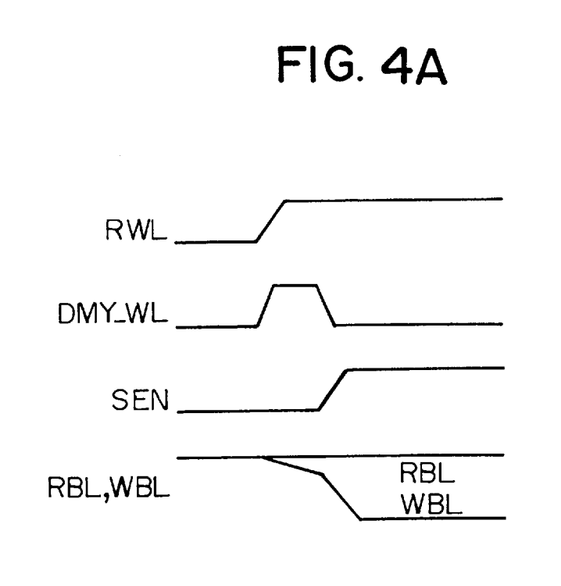
FIGS. 4A and 4B are timing diagrams showing the operation of the first embodiment.

When a low level is stored at the storage node C as shown in FIG. 4A, NMOS transistor 24b remains off. While the read bit line RBL retains the power supply voltage pre-charged by the pre-charge circuit 12, the write bit line WBL is discharged by the dummy cell 14 because NMOS transistor 22b remains continuously on. A voltage difference responsive to the information in the memory cell 16 thus takes place between the read bit line RBL and the write bit line WBL.

Figure 4B:
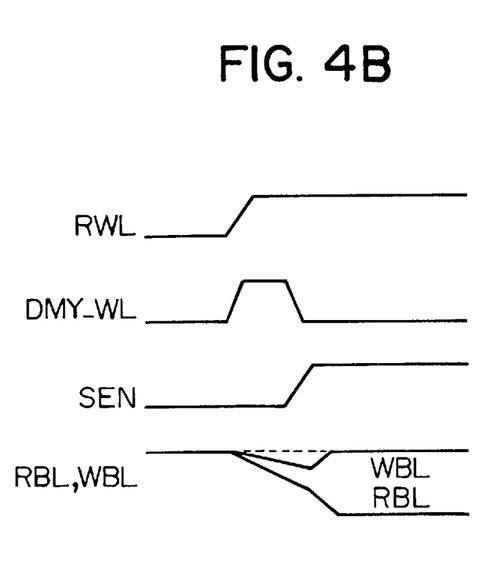

When a high level is stored at the storage node C as shown in FIG. 4B, both NMOS transistor 24b and NMOS transistor 22b remain on, and both the read bit line RBL and the write bit line WBL are discharged. By making the driving power of the dummy cell 14 smaller than the driving power of the memory cell 16, a voltage difference responsive to the information in the memory cell 16 thus takes place between the read bit line RBL and the write bit line WBL.

Any direct current needs to be prevented from flowing from the latch-type sense amplifier 18 to the dummy cell 14 after a sufficient voltage difference takes place between the read bit line RBL and the write bit line WBL. Thus, the dummy word line DMV_WL is driven low and the dummy cell is turned off. Furthermore, by driving the sense enable line SENN high and driving the line SENP low, the latch-type sense amplifier 18 amplifies the information read from the memory cell 16 to the write bit line WBL and the read bit line RBL to a maximum amplitude and then latches it.

The information in the memory cell 16 read to the read bit line RBL is now read to the data line DL via NMOS transistor 30b by driving the column select line Y high while the information in the memory cell 16 read to the write bit line WBL is written to the storage node C via NMOS transistor 24a by driving the write bit line WWL high. The read operation is thus performed while the memory cell 16 is refreshed.

A second embodiment of the present invention will now be discussed referring to FIGS. 5 through 7B.

Figure 5:
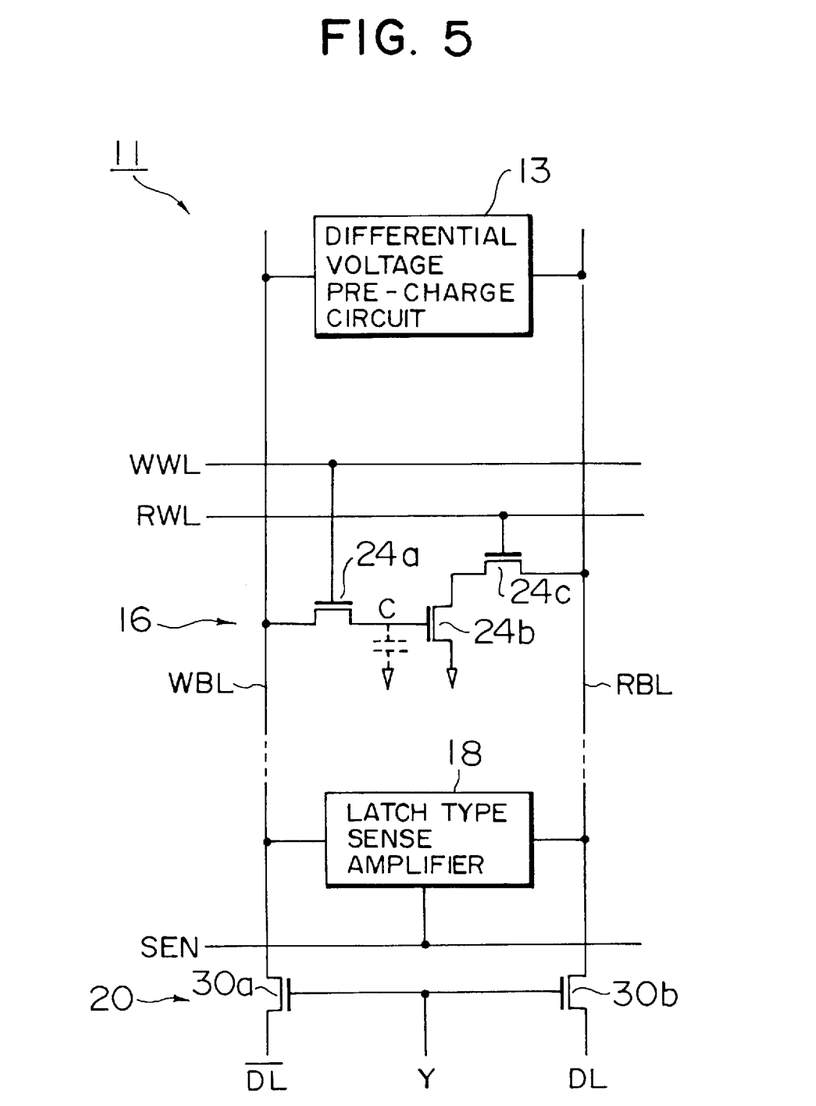
FIG. 5 is a schematic diagram of a second embodiment.

FIG. 5 is a schematic diagram of the three-transistor cell DRAM semiconductor memory device according to the second embodiment. The three-transistor cell type DRAM 11 is constructed of a memory array with a plurality of word rows arranged from top to bottom and with a plurality of bit columns arranged from left to right. Each bit column includes a differential voltage generating pre-charge circuit 13, a memory cell 16, a latch-type sense amplifier 18 and a column selector 20.

In the three-transistor cell type DRAM 11, the differential voltage generating pre-charge circuit 13 pre-charges a read bit line RBL to a power supply voltage during a standby state in which neither read operation nor write operation is performed. In the present invention, a refresh operation is concurrently performed along with a read operation as will be described below. The differential voltage generating pre-charge circuit 13 also pre-charges a write bit line WBL to a voltage slightly lower than that of the read bit line RBL. The voltage difference between the read bit line and the write bit line is large enough to be sensed by the sense amplifier.

Figure 6A:
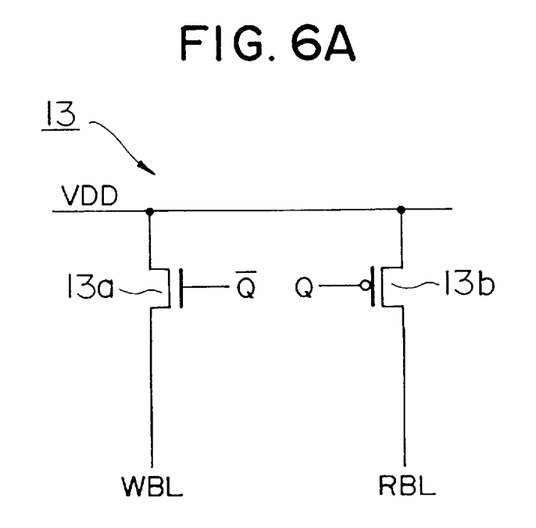
FIGS. 6A and 6B are schematic diagrams of differential voltage generating pre-charge circuits that may be used in the second embodiment.
Figure 6B:
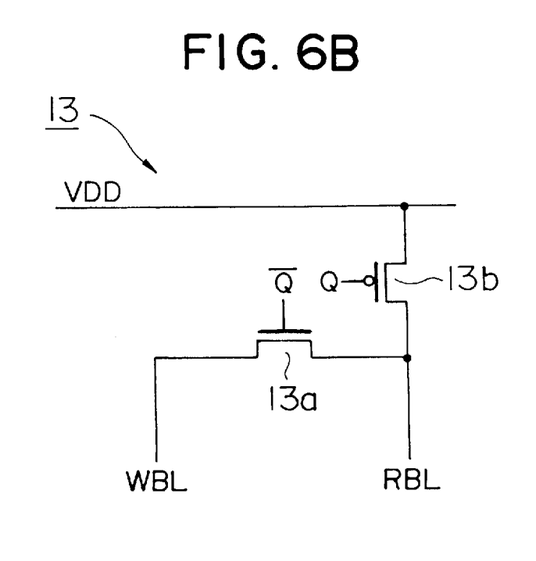

Examples of the pre-charge circuit 13 of the second embodiment are shown in FIG. 6A and FIG. 6B. The circuit shown in FIG. 6A includes NMOS transistor 13a and PMOS transistor 13b. The drain of transistor 13a and the source of transistor 13b are both connected to the power supply voltage VDD, and the source of transistor 13a and the drain of transistor 13b are respectively connected to the write bit line WBL and the read bit line RBL. The gates of transistors 13b and 13a are respectively coupled to a pre-charge signal Q and an inverted pre-charge signal Q⁻. When the pre-charge signal Q is transitioned to a low level, the read bit line RBL is pre-charged to a voltage level approximately equal to VDD, while the write bit line WBL is pre-charged to a voltage level which is lower than VDD by the threshold voltage of the NMOS transistor. The circuit shown in FIG. 6B is a modified version of the circuit shown in FIG. 6A. The write bit line WBL is connected to the read bit line RBL via NMOS transistor 13a. The differential voltage generating pre-charge circuit that is incorporated in the second embodiment of the present invention may be of any other circuit arrangement as long as it pre-charges the read bit line to the power supply voltage while pre-charging the write bit line WBL to a differential voltage relative to the read bit line RBL where the differential voltage has to be large enough to be sensed by the sense amplifier. The differential voltage is preferably 0.2 V or over to preclude an error resulting from noise.

The construction and operation of the memory cell 16, latch-type sense amplifier 18 and column selector 20 remain unchanged from those in the first embodiment, and the explanation about them are not repeated here.

The operation of the three-transistor cell type DRAM will now be discussed with reference to the timing diagrams of FIGS. 7A and 7B.

During a standby state in which neither write operation nor read operation to the memory cell 16 is performed, the differential voltage generating pre-charge circuit 13 is turned on. The read bit line RBL is pre-charged to the power supply voltage while the write bit line WBL is pre-charged to a voltage which is lower than the power supply voltage by approximately 0.5 V.

In a write operation to the memory cell 16, the differential voltage generating pre-charge circuit 13 is turned off. After the pre-charging of the write bit line WBL and the read bit line RBL is stopped, the column select line Y and write word line WWL are driven high. Out of write data input through the inverted data line DL- and the data line DL, write data input through the inverted data line DL- is written to the storage node C via NMOS transistors 30a, 24a.

When a high level is input as write data, for example, the inverted data line DL- and the data line DL are respectively driven low and high, and a low level is written to the storage node C. On the other hand, when a low level is input as write data, for example, the inverted data line DL- and the data line DL are respectively driven high and low, and a high level is written to the storage node C.

To read information retained in the memory cell 16, the differential voltage generating pre-charge circuit 13 is turned off. After the pre-charging of the write bit line WBL and the read bit line RBL is stopped, the read word line RWL is driven high, and NMOS transistor 24c is turned on. The information stored at the storage node C is read to the read bit line RBL via NMOS transistors 24b, 24c.

Figure 7A:
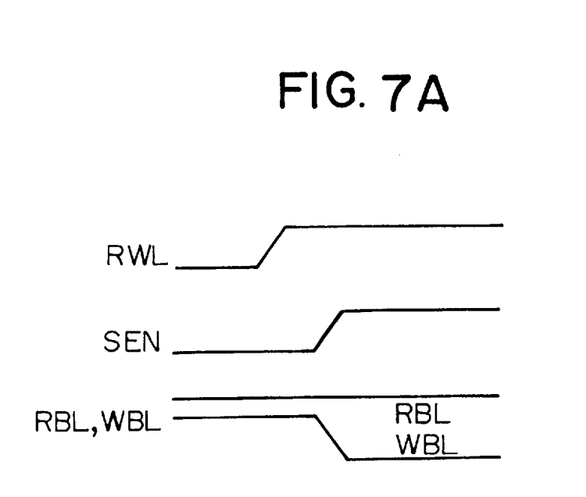
FIGS. 7A and 7B are timing diagrams showing the operation of the second embodiment.

When a low level is stored at the storage node C as shown in FIG. 7A, NMOS transistor 24b remains off. While the read bit line RBL retains the power supply voltage pre-charge by the differential voltage generating pre-charge circuit 13, a voltage difference responsive to the information in the memory cell 16 thus takes place between the read bit line RBL and the write bit line WBL.

Figure 7B:
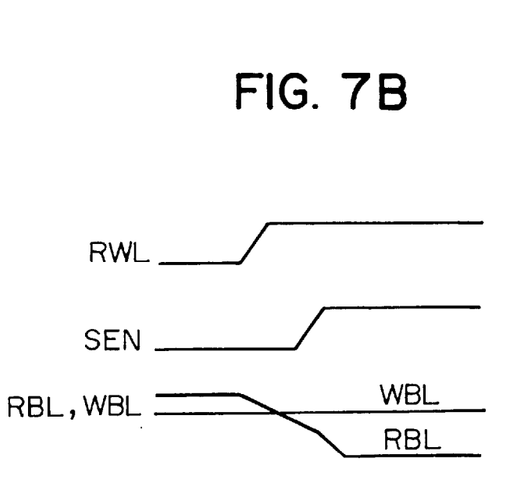

When a high level is stored at the storage node C as shown in FIG. 7B, NMOS transistor 24b remains on. The read bit line RBL is discharged to be below the voltage level of the write bit line WBL, and thus a voltage difference responsive to the information in the memory cell 16 thus takes place between the read bit line RBL and the write bit line WBL.

After the voltage of the read bit line RBL becomes sufficiently lower than that of the write bit line WBL, the sense enable line SENN is driven high and SENP is driven low. The latch-type sense amplifier 18 amplifies the information read from the memory cell 16 to the write bit line WBL and the read bit line RBL to a maximum amplitude and then latches it.

The information in the memory cell 16 read to the read bit line RBL is now read to the data line DL via NMOS transistor 30b by driving the column select line Y high while the information in the memory cell 16 read to the write bit line WBL is written to the storage node C via NMOS transistor 24a by driving the write bit line WWL high. The read operation is thus performed while the memory cell 16 is refreshed.

As described above, the semiconductor device of the present invention reads information from the memory cell while refreshing the information of the memory cell. When a sequential address accessing is made to the memory array like data transfer, the refresh operation of the memory cells is eliminated, and the efficiency of data transfer is increased. Even when no sequential address accessing is made, a read operation is always accompanied by a refresh operation. No dedicated circuit for the refresh operation or independent process for refresh is required. The execution of a read operation means the execution of a refresh operation.

While the invention has been described in relation to preferred embodiments, many modifications and variations are apparent from the description of the invention, and all such modifications and variations are intended to be within the scope of the present invention as defined in the appended claims.

What is claimed is:

1. A three-transistor cell type dynamic random-access memory comprising:
    a write bit line;
    a read bit line;
    a write word line;
    a read word line;
    a memory cell including a first transistor, a second transistor and a third transistor, wherein a drain of the first transistor is connected to the write bit line, a source of the first transistor is connected to a gate of the second transistor, a gate of the first transistor is connected to the write word line, a source of the second transistor is grounded, a drain of the second transistor is connected to a source of the third transistor, a drain of the third transistor is connected to the read bit line, and a gate of the third transistor is connected to the read word line;
    a generating circuit arranged between the write bit line and the read bit line that generates a voltage difference, during a read operation, responsive to information that is stored in the memory cell; and a sense amplifier that amplifies and latches the voltage difference generated between the write bit line and the read bit line, wherein when the information is read from the memory cell, the information from the memory cell amplified by the latch-type sense amplifier is read from the read bit line and is written to the memory cell via the write bit line to refresh the information in the memory cell.

2. The dynamic random-access memory according to claim 1, wherein the generating circuit includes a pre-charge circuit for pre-charging the write bit line and the read bit line to a substantially equal voltage, and a dummy cell for discharging the write bit line in response to a signal on a dummy word line.

3. The dynamic random-access memory according to claim 2, wherein the dummy cell includes a first NMOS transistor, a second NMOS transistor and a third NMOS transistor, wherein a drain of the first NMOS transistor is connected to the write bit line, a source of the first NMOS transistor is connected to a drain of the second NMOS transistor, a gate of the first NMOS transistor is connected to the dummy word line, a source of the second NMOS transistor is grounded, a gate of the second NMOS transistor is connected to a source of the third NMOS transistor, and a gate and a drain of the third NMOS transistor are both connected to a power supply.

4. The dynamic random-access memory according to claim 3, wherein the three transistors constituting the memory cell are each an NMOS transistor.

5. The dynamic random-access memory according to claim 1, wherein the circuit includes a differential voltage generating pre-charge circuit for pre-charging a differential voltage between the write bit line and the read bit line.

6. The dynamic random-access memory according to claim 5, wherein the differential voltage generating pre-charge circuit pre-charges the read bit line substantially to a power supply voltage, and pre-charges the write bit line to a voltage that is lower than the voltage of the read bit line.

7. The dynamic random-access memory according to claim 6, wherein the differential voltage generating pre-charge circuit sets the voltage of the write bit line to be lower than the voltage of the read bit line by the threshold voltage of the MOS transistor.

8. A semiconductor integrated circuit comprising a three-transistor cell type dynamic random-access memory comprising:

a write bit line;

a read bit line;

a write word line;

a read word line;

a memory cell including a first transistor, a second transistor and a third transistor, wherein a drain of the first transistor is connected to the write bit line, a source of the first transistor is connected to a gate of the second transistor, a gate of the first transistor is connected the write word line, a source of the second transistor is grounded, a drain of the second transistor is connected to a source of the third transistor, and a drain of the third transistor is connected to the read bit line, a gate of the third transistor is connected to the read word line;

a generating circuit arranged between the write bit line and the read bit line that generates a voltage difference, during a read operation, responsive to information that is stored in the memory cell;

a sense amplifier that amplifies and latches the voltage difference generated between the write bit line and the read bit line, wherein when the information is read from the memory cell, the information from the memory cell amplifier by the latch-type sense amplifier is read from the read bit line and is written to the memory cell via the write bit line to refresh the information in the memory cell.

9. The semiconductor integrated circuit according to claim 8, wherein the generating circuit including a pre-charge circuit for pre-charging the write bit line and the read bit line to a substantially identical voltage, and a dummy cell for discharging the write bit line in response to a signal on a dummy word line.

10. The semiconductor integrated circuit according to claim 9, wherein the dummy cell including a first NMOS transistor, a second NMOS transistor, and a third NMOS transistor, wherein a drain of the first transistor is connected to the write bit line, a source of the first transistor is connected to a drain of the second transistor, a gate of the first transistor is connected to the dummy word line, a source of the second transistor is grounded, a gate of the second transistor is connected to a source of the third transistor, and a gate and a drain of the third transistor are both connected to a power supply.

11. The semiconductor integrated circuit according to claim 10, wherein the three transistors constituting the memory cell are each an NMOS transistor.

12. The semiconductor integrated circuit according to claim 11, wherein the generating circuit includes a differential voltage generating pre-charge circuit for pre-charging a differential voltage between the write bit line and the read bit line.

13. The semiconductor integrated circuit according to claim 12, wherein the differential voltage generating pre-charge circuit pre-charges the read bit line substantially to a power supply voltage, and pre-charges the write bit line to a voltage that is lower than the voltage of the read bit line.

14. The semiconductor integrated circuit according to claim 13, wherein the differential voltage generating pre-charge circuit sets the voltage of the write bit line to be lower than the voltage of the read bit line by the threshold voltage of the MOS transistor.

* * * * *